United States Patent [19]

Swatton

[11] Patent Number: 5,135,837
[45] Date of Patent: Aug. 4, 1992

[54] PHOTOSENSITIVE ELASTOMERIC ELEMENT HAVING IMPROVED SOLVENT RESISTANCE

[75] Inventor: David W. Swatton, N. Middletown, N.J.

[73] Assignee: E. I. Du Pont de Nemours and Company, Wilmington, Del.

[21] Appl. No.: 576,986

[22] Filed: Sep. 5, 1990

[51] Int. Cl.⁵ .................. G03F 7/033; G03F 7/11; G03F 7/30
[52] U.S. Cl. .................. 430/273; 430/286; 430/306; 430/912; 430/907; 522/121; 522/125
[58] Field of Search ............. 430/286, 306, 273, 912, 430/907; 522/121, 125

[56] References Cited

U.S. PATENT DOCUMENTS

| | | | |
|---|---|---|---|
| 4,430,417 | 2/1984 | Heinz et al. | 430/286 |
| 4,460,675 | 7/1981 | Gruetzmacher et al. | 430/300 |
| 4,686,172 | 8/1987 | Worns et al. | 430/286 |

Primary Examiner—Cynthia Hamilton
Attorney, Agent, or Firm—Karen K. King

[57] ABSTRACT

A photosensitive elastomeric composition and process of using the composition to prepare flexographic printing plates having substantially improved solvent resistance are described.

16 Claims, No Drawings

PHOTOSENSITIVE ELASTOMERIC ELEMENT HAVING IMPROVED SOLVENT RESISTANCE

FIELD OF INVENTION

This invention relates to a photosensitive elastomeric composition and process of using the composition in preparing flexographic printing plates. More particularly, it relates to an improved photosensitive elastomeric composition which can be used to produce a flexographic plate having increased resistance to printing ink solvents and reduced shrinkdown.

BACKGROUND OF THE INVENTION

Photosensitive elements which can be used to prepare flexographic printing plates generally comprise (1) an addition polymerizable nongaseous ethylenically unsaturated monomer, (2) a photoinitiating system activated by actinic radiation and (3) an elastomeric or thermoplastic-elastomeric polymeric binder comprising polymerized conjugated diene monomers. Photosensitive compositions such as these frequently utilize plasticizers to increase the softness and flexibility of the developed flexographic plates.

Processes for producing a flexographic printing plate from a photosensitive element are well known in the art. Typically, a plate is formed by first, exposing imagewise a photopolymerizable element to actinic radiation. Unexposed areas are subsequently washed off using a suitable developer solvent. The plate is then dried and, if necessary, treated to remove surface tackiness. To ensure final plate hardening and photopolymerization, the printing plate can be further post exposed. Following development, the printing plate is ready to be mounted on a cylinder and the printing process is initiated.

It has been found that during printing, the thickness of the plates may decrease. It is believed that the decrease in plate thickness may be due to prolonged exposure to the solvents in the printing inks which leach out materials in the plate such as plasticizers and unreacted monomer. This thickness loss results in poorer print quality as the printing run progresses. It is particularly deleterious to critical four-color printing. It is not possible to correct this by simply removing the plasticizer because plates without plasticizer are too hard and have insufficient print quality. Nor can this problem be solved by reducing the exposure time to the solvents in the printing inks because this would impact on print quality as well as reduce the number of copies during printing.

SUMMARY OF THE INVENTION

This invention relates to a photosensitive element comprising a support and a photopolymerizable layer, said photopolymerizable layer comprising:

(a) a thermoplastic elastomeric block copolymer binder;

(b) a photoiniator system;

(c) at least one nongaseous ethylenically unsaturated monomer; and (d) a liquid polisoprene plasticizer having a molecular weight of at least about 29,000;

wherein the solvent resistance of said element is substantially improved.

In a preferred embodiment of this invention, the flexographic photosensitive element described above comprises a multilayer cover element adjacent to the photopolymerizable layer. The multilayer cover element consists essentially of a flexible cover film, a layer of an elastomeric composition, and optionally, a flexible polymeric film. The layer of elastomeric composition is in contact with the photopolymerizable layer and is photosensitive or becomes photosensitive by contact with the photopolymerizable layer. The elastomeric layer comprises an elastomeric polymeric binder, a second polymeric binder and optionally a nonmigratory dye or pigment. If a flexible polymeric film is used, it is present adjacent to the cover film.

In another embodiment, this invention relates to a process for increasing the solvent resistance of a flexographic printing plate, thereby reducing the amount of plate thickness loss during printing.

DETAILED DESCRIPTION OF THE INVENTION

Polymeric molecular weights referred to herein are determined by viscosity measurements.

The photosensitive elements of this invention can be used to produce an improved flexographic relief printing plate with greater solvent resistance. By the term "substantially improved solvent resistance," it is meant that a plate with liquid polyisoprene has less thickness loss during use than plasticized plates without liquid polyisoprene. The improvement is due to the addition of a specific plasticizer in formulating the photopolymerizable layer of the photosensitive element. The plasticizer should have sufficient compatibility with the binder in the photopolymerizable layer so that the plate is essentially nonlight scattering or cloudy. In addition, the plasticizer should impart sufficient softness to the developed relief plate and be resistant to leaching by the solvents which are used with printing inks. It has been found that liquid polyisoprene polymers having a molecular weight of at least about 29,000 when used with an elastomeric polymeric binder, such as styrene-isoprene-styrene, satisfies all of the above criteria.

In practicing this invention, polyisoprenes with a molecular weight of at least about 29,000 and which are liquid at room temperature are acceptable. It is preferred that the polyisoprene have a molecular weight in the range of about 29,000 to 50,000. Liquid polyisoprene polymers in this molecular weight range are commercially available from the Kuraray Chemical Company (Tokyo, Japan) as LIR-30 (molecular weight=29,000) and LIR-50 (molecular weight=47,000).

The amount of polyisoprene present in the photopolymerizable layer should be sufficient to impart softness and flexibility to the developed printing relief, without causing a deleterious effect on the other properties of the photosensitive element. Generally, the amount of polyisoprene should be in the range of 5% to 30% based on the weight of the photopolymerizable layer. The preferred amount of polyisoprene is about 8%.

The binder in the photopolymerizable layer of the photosensitive element of the invention is an elastomeric polymer. Suitable binders can include natural or synthetic polymers of conjugated diolefin hydrocarbons, including 1,2-polybutadiene, 1,4-polybutadiene, butadiene/acrylonitrile, butadiene/styrene, thermoplastic-elastomeric block copolymers e.g., styrene-butadiene-styrene block copolymer, styrene-isoprene-styrene block copolymer, etc., and copolymers of the binders. The block copolymers discussed in U.S. Pat. Nos. 4,343,646; 4,430,417; and 4,045,231, all of which are incorporated by reference, can be used. The Kraton ® family of triblock copolymers are manufactured by the Shell Chemical Company (Houston, TX) and are also suitable for practicing this invention. However, in practicing the instant invention, a preferred binder is a styrene-butadiene-styrene block copolymer. A more preferred binder for practicing this invention is a styrene-isoprene-styrene block copolymer. Such binders are well known in flexographic photosensitive elements and have been disclosed in, for example, Chen U.S. Pat. No. 4,323,636. It is preferred that the binder be present in at least an amount of 65% by weight of the photosensitive layer.

The term binder, as used herein, also encompasses core shell microgels or blends of microgels and performed macromolecular polymers.

Monomers suitable for the practice of the present invention are addition-polymerizable ethylenically unsaturated compounds. The photosensitive layer can contain a single monomer or a mixture of monomers which must be compatible with the binder to the extent that a clear, non-cloudy photosensitive layer is produced. Monomers that can be used in the photosensitive layer are well known in the art. Examples of such monomers can be found in U.S. Pat. Nos. 4,323,636; 4,753,865; 4,726,877 and 4,894,315. It is preferred that the monomer be present in at least an amount of 5% by weight of the photosensitive layer.

The photoinitiating system can be practically any organic compound or group of compounds which is radiation sensitive, free radical generating and which initiates polymerization of the monomer or monomers without excessive termination. It should be activatable by actinic radiation and thermally inactive at and below 185° C. Photoinitiating systems of this type include the substituted and unsubstituted polynuclear quinones. Examples of suitable systems have been disclosed in Gruetzmacher et al., U.S. Pat. No. 4,460,675 and Feinberg, U.S. Pat. No. 4,894,315. Initiator systems are present in amounts from 0.001% to 10.0% based on the weight of the photopolymerizable composition.

The photopolymerizable layer can also contain a thermal polymerization inhibitor. Inhibitors which can be used include: p-methoxyphenol, hydroquinone, and alkyl and aryl-substituted hydroquinones and quinones, tert-butyl catechol, pyrogallol, copper resinate, naphthalamines, beta-naphthol, cuprous chloride, 2,6-di-tert-butyl-p-cresol, phenothiazine, pyridine, nitrobenzene and dinitrobenzene, p-toluquinone and chloranil. The N-nitroso compositions disclosed in U.S. Pat. No. 4,168,982 are also useful thermal polymerization inhibitors. In this invention, ihibitors are usually present in an amount at least 0.001% by weight of the photopolymerizable composition.

The photopolymerizable layer can contain other additives depending on the final properties desired. Such additives include colorants, antioxidants, antiozonants, fillers or reinforcing agents.

Materials suitable for a base or support include metals, e.g., steel and aluminum plates, sheets and foils, films or plates composed of various film-forming synthetic resins or polymers, such as the addition polymers and linear condensation polymers. However, preferred support materials are polyester films such as polyethylene terephthalate.

A transparent cover sheet such as a thin film of polystyrene, polyethylene, polypropylene or other strippable material can be used as a cover element to prevent contamination of or damage to the photopolymerizable layer during storage or manipulation. The cover sheet can also include a thin, hard, flexible, solvent-soluble layer, e.g., a layer of a polyamide, copolymer of polyethylene and polyvinyl acetate, etc., can be used on the upper surface of the photopolymerizable layer to protect for reuse, the image-bearing negative or transparency superposed thereon, or to improve contact or alignment with the photosenstive surface.

In the present invention, it is preferred to use a multi-layer cover element consisting essentially of a flexible cover film, optionally a flexible polymeric film, and a layer of an elastomeric composition which is photosensitive or becomes photosensitive by contact with the photopolymerizable layer. Such multilayer cover elements are disclosed in Gruetzmacher et al. U.S. Pat. Nos. 4,427,759 and 4,460,675, and are herein incorporated by reference. The flexible cover film, which can be subcoated, is generally polyester, polystyrene, polyethylene, polypropylene or other strippable film.

The optional flexible polymeric film layer is present adjacent to the cover film. This layer is soluble or strippable in developer solutions during processing of the exposed element to form a relief image and is preferably a polyamide, copolymer of ethylene and vinyl acetate, etc.

The elastomeric layer of the multilayer cover element should have an elastic modulus in the polymerized state not substantially less than the elastic modulus of the photopolymer layer in the exposed state. The elastomeric composition comprises an elastomeric polymeric binder, a second polymeric binder and optionally a nonmigratory dye or pigment. The elastomeric polymeric binder in the elastomeric composition is generally the same as or similar to the elastomeric binder present in the photopolymer layer.

The photopolymer compositions of this invention can be prepared in many ways by admixing the binder, monomer, initiator, polyisoprene plasticizer and other ingredients. However, it is preferred that the photopolymerizable element be made by forming the photopolymer mixture into a hot melt. This can be carried out by placing the mixture in a mixing device such as a rubber mill which can be part of a calender device. Alternatively, the mixture can be placed in an extruder which performs the function of melting, mixing, deaerating and filtering the composition. A twin screw extruder or other extruders known to those skilled in the art can be used. The temperature of the melt in the extruder is within the range of about 130° to 230° C., and the composition remains in the extruder for about 0.5 to 5 minutes.

The photopolymerizable composition can then be applied directly to the support and treated to achieve the desired thickness. It is preferred that this be accomplished by calendering the photopolymerizable composition between the support and a cover layer. Calendering is accomplished by passing the photopolymerizable composition from the mixing device or extruder into the nip of a calender and calendering while hot between the support and a cover layer, preferably the multilayer cover element described above.

Alternatively, the photopolymerizable material can be placed between the support and a cover layer in a mold. The material is then pressed flat by the application of heat and/or pressure. The cover layer can be any of the materials discussed above and is preferably the multilayer cover element. The photopolymerizable material can also be pressed between two support materials, one of which is later removed so that a multilayer cover element can be laminated to the photopolymer layer.

In general, the process of preparing a flexographic printing plate from a photopolymerizable element includes the steps of main image exposure, development or washout, and post-development treatment. Post-development treatment can include any or all of the following: drying, overall post-exposure, and surface detackification.

A backflash exposure may be used with elements having a transparent support. Backflash generally uses a radiation source the same as or similar to that used for the main imagewise exposure, as discussed below. It serves to sensitize the plate and establishes the depth of the plate relief. The backflash procedure gives the photopolymer layer a uniform and relatively short exposure through the support, thereby photocrosslinking the binder and monomer in the support region.

Printing reliefs can be made from the photosensitive elements of this invention by exposing to actinic radiation selected portions of the photopolymerizable layer through an image-bearing transparency. The ethylenically unsaturated monomer is polymerized or cross-linked in those areas exposed to actinic radiation resulting in reduced solubility or swellability in developer solvents. No significant polymerization or cross-linking takes place in the unexposed areas of the layer. The image-bearing transparency can be constructed of any suitable material including cellulose acetate film and oriented polyester film.

Actinic radiation from any source and of any type can be used in the photopolymerization process. The radiation can emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer beneath the clear portions of the transparency. This results in a polymeric relief having its greatest width at the bottom of the photopolymerizable layer, i.e., a frustum, and the top surface of the relief have the dimensions of the clear area.

The free-radical generating systems activatable by actinic radiation generally exhibit their maximum sensitivity in the ultraviolet range, therefore, the radiation source should furnish an effective amount of this radiation, preferably having a wavelength range between about 250 nm and 500 nm, and more preferably 300 to 420 nm. In addition to sunlight, suitable radiation sources include carbon arcs, mercury-vapor arcs, fluorescent lamps, lasers, electron flash units and photographic flood lamps. Electron accelerators and electron beam sources through an appropriate mask can also be used. The most suitable source of radiation are the mercury-vapor lamps, particularly the sun lamps, are most suitable. A standard radiation source is the Sylvania 350 Blacklight fluorescent lamp (FR 48T12/350 VL/VHO/180, 115 w) which has a central wavelength of emission around 354 nm.

The radiation exposure time can vary from fractions of a second to minutes, depending upon the intensity and spectral energy distribution of the radiation, its distance from the photopolymer element, and the nature and amount of the photopolymer composition. Typically, a mercury vapor arc or a sunlamp is used at a distance of about 1.5 to about 60 inches (3.8 to 153 cm) from the photosensitive element. Exposure temperatures are preferably ambient or slightly higher, i.e., about 20° to about 35° C.

Following imagewise exposure, the image can be developed by washing with a suitable developer. Solvent development is usually carried out at about room temperature. Suitable developer solvents for the compositions of the present invention include aromatic or aliphatic hydrocarbon and aliphatic or aromatic halohydrocarbon solvents, for example, perchloroethylene, 1,1,1-trichloroethane, tetrachloroethane, trichloroethylene, benzene, toluene, xylene, hexane, isononylacetate, methylisobutylketone, or mixtures of such solvents with suitable alcohols. Other organic solvent developers have been disclosed in published German Application No. 3828551.

Development time can vary, but it is preferably in the range of about 5 to 25 minutes. Developer can be applied in any convenient manner, including immersion, spraying and brush or roller application. Brushing aids in removing the unpolymerized or non-crosslinked portions of the composition. Washout is frequently carried out in an automatic processing unit which uses solvent and mechanical brushing action to remove the unexposed portions of the plate, leaving a relief constituting the exposed image and floor.

Following solvent development, the relief printing plates are generally blotted or wiped dry, and then dried in a forced air or infrared oven. Drying times and temperature may vary, however, typically the plate is dried for 60 to 120 minutes at 60° C. High temperatures are not recommended because the support can shrink and this can cause registration problems. Additional air drying overnight for 16 hours or more is common. The solvent will continue to evaporate from the printing relief during drying at ambient conditions.

Most flexographic printing plates are uniformly post-exposed to ensure that the photocrosslinking process is complete and that the plate will remain stable during printing and storage. This "post-exposure" step utilizes the same ultraviolet radiation source as the main exposure i.e. most preferably, wavelengths of 300 to 420 nm. Post-exposure is carried out to complete polymerization and maximize plate durability, but it does not remove surface tackiness.

Detackification is an optional post-development treatment which can be applied if the surface is still tacky. Tackiness can be removed by methods well known in the art such as treatment with bromine or chlorine solutions. See, e.g., U.S. Pat. No. 4,400,460 and German Patent, DE No. 2 823 300. U.S. Pat. No. 4,400,459 to Gruetzmacher et al. teaches a process for detackifying photosensitive elastomeric flexographic printing plates, wherein the developed dried surface is, in either order, (1) post-exposed to actinic radiation, and (2) treated with a solution of an alkali monopersulfate and a bromide salt.

Exposure to radiation sources having a wavelength not longer than 300 nm has also been used to remove plate tackiness. For example, European Published Patent Application No. 0 017927 to Nakamura et al. describes a process for detackifying a photosensitive elastomeric printing plate using a light source emitting light with a wavelength in the range of 200 to 300 nm. The light sources disclosed include heavy-hydrogen lamps, low-pressure mercury lamps, and germicidal lamps. Gibson, U.S. Pat. No. 4,806,506 the disclosure of which is hereby incorporated by reference, teaches an improved process for detackifying an imagewise exposed and solvent-developed photopolymeric flexographic relief printing plate wherein an aprotic organic solvent is applied to the surface of the printing plate after the developed plate is dried but prior to irradiation with light having wavelengths in the 200 to 300 nm range. As discussed above, the light finishing exposure can also be accomplished using a high intensity radiation source such as the Fusion lamp or Western Quartz lamp.

The advantageous properties of this invention can be observed by reference to the following examples which illustrate but do not limit the practice of the invention.

EXAMPLES

In the following examples, all percentages are by weight unless otherwise specified. Polymeric molecular weights referred to herein are determined by viscosity measurements.

Unless otherwise indicated, the following are as specified:

Binder 1: styrene/isoprene/styrene block copolymer; Kraton ® 1107 from Shell Chemical Co., Houston, TX Binder 2: styrene/butadiene/styrene block copolymer with white mineral oil; Kraton ® 2104 from Shell Chemical Co., Houston, TX Binder 3: styrene/butadiene/styrene block copolymer; Kraton ® 1102 from Shell Chemical Co., Houston, TX PB-1 liquid polybutadiene; Polyoil 110/130 from Nudex, Inc., Piscataway, NJ PB-2 liquid 1,2-polybutadiene; Nisso PB-1000 from Nippon Soda Co., Ltd., Tokyo, Japan Plasticizer naphthenic oil containing 5-6 carbon cycloparrafins and saturated alkyl derivatives; Shellflex ® 371 from Shell Chemical Co., Houston, TX PI-1 liquid polyisoprene with a molecular weight of 29,000; LIR-30 from Kuraray Chemical Co., Tokyo, Japan PI-2 liquid polyisoprene with a molecular weight of 47,000; LIR-50 from Kuraray Chemical Co., Tokyo, Japan Piccotex copolymer of vinyl toluene and alpha methyl styrene; Piccotex ® 100S from Hercules Co., Wilmington, DE Wax: Ceresin wax HMDA: 1,6-hexanediol diacrylate HMDMA: 1,6-hexanediol dimethacrylate Initiator: 2,-phenyl-2,2-dimethoxy acetophenone Inhibitor: 2,6-dimethyl-4-t-butyl phenol HEMA: hydroxyethyl methacrylate Red dye: Neozapon ® Red dye from BASF Wyandotte Corp. Holland, Mich.

MABS methyl methacrylate/acrylonitrile/butadiene/styrene; Blendex ® 491 Borg Warner Chemicals Co., Parkersburg, WV Blue dye Atlantic Fast Wool Blue R Dye from Atlantic Chemicals Co., Nutley, NJ In the following examples, a durometer was used to determine the Shore A hardness of the plates. Additionally, plate shrinkdown was determined in the following manner.

Samples 1.25 by 3 inch (3.2 by 7.6 cm) were cut from unexposed plates and the thickness measured in three areas of each sample. The plate samples were then exposed through the back for 30 seconds on the Cyrel ® 30×40 exposure unit. Similarly, the front side was exposed for 10 minutes in the same exposure unit. The exposed plate samples were washed for 5 minutes in the Cyrel ® 30×40 rotary processor using tetrachloroethylene/n-butanol (75/25 volume percent) as the developing solvent. The sample plates were then dried in an oven at 60° C. for two hours. Following drying, the sample plates were detackified and post-exposed for 8 minutes in a Du Pont Cyrel ® Light Finish/Post Exposure unit Model No: Cyrel ® 3248 LT-FIN-Px.

The finished plate samples were then soaked in a solution of n-propyl alcohol and n-propyl acetate (80/20 by weight) for 24 hours with stirring. The plate samples were subsequently dried in an oven for 18 hours at 60° C. The thickness of the plate sample was again measured in three areas. The thickness loss was the difference between the thickness of the unexposed plate sample and the thickness of the final plate sample.

EXAMPLES 1-3

The following photopolymer compositions were prepared using the ingredients listed below in parts by weight:

| | Example | | |
|---|---|---|---|
| Ingredient | 1 (Control) | 2 | 3 |
| Binder 1 | 72 | 72 | 72 |
| Plasticizer | 8 | — | — |
| PI-1 | — | 8 | — |
| PI-2 | — | — | 8 |
| Piccotex | 6 | 6 | 6 |
| Wax | 1 | 1 | 1 |
| HMDA | 5.2 | 5.2 | 5.2 |
| HMDMA | 3.7 | 3.7 | 3.7 |
| Initiator | 2 | 2 | 2 |
| Inhibitor | 2 | 2 | 2 |
| HEMA | 0.176 | 0.176 | 0.176 |
| Red Dye | 0.0045 | 0.0045 | 0.0045 |

A multilayer cover element was prepared by coating a 5 mil (0.013 cm) polyethyleneterephthalate cover sheet with a first layer of Macromelt ® 6900 polyamide (Henkel Corp., Minneapolis, MN) at a coating weight of 40 mg/dm² and a second 1.8 mil (0.0046 cm) thick layer of a blend at a coating weight of 480 mg/dm². The blend consists essentially of the following ingredients in parts by weight:

| Ingredients | Parts |
|---|---|
| Binder 1 | 66.7 |
| MABS | 31.5 |
| Blue Dye | 1.8 |

The photopolymer compositions were mixed on a two roll mill at 115°-120° C. for 15 minutes. The mixed compositions were placed between a support sheet of flame-treated polyethyleneterephthalate 5 mils (0.013 cm) thick and a coversheet of 5 mil (0.013 cm) polyethyleneterephthalate coated with Macromelt ® 6900 polyamide at a coating weight of 40 mg/dm². This was then placed in a hydraulic press at 140° C. and pressed out to form a total thickness, photopolymer plus support and Macromelt ® coated coversheet, of 112 mils (0.285 cm). The coversheet with polyamide layer was removed from the photopolymer layer and the photopolymer layer with support was then laminated to the second layer of the multilayer cover element to form the final photosensitive printing element comprising:

support, photopolymer layer, MABS layer, polyamide layer and coversheet.

The thickness loss and the Shore A hardness are summarized in Table 1 below which shows that the plates with polyisoprene had less thickness loss than plates with Shellflex ® plasticizer.

TABLE 1

| Example | Thickness Loss (mils) | Shore A Hardness |
| --- | --- | --- |
| 1 (control) | 3.35 | 55 |
| 2 | 1.40 | 53 |
| 3 | 0.55 | 54 |

EXAMPLE 4

The ingredients for the photopolymer composition of Example 2 were fed into an 83 mm twin screw extruder and extruded at 182° C. between the support sheet and the mulilayer cover element as described in Examples 1–3. The total thickness, except for the polyethylene terephalate cover sheet, was 107 mils (0.272 cm). The thickness loss was determined and the results are provided in Table 2 below.

EXAMPLE 5

The ingredients for the photopolymer composition of Example 1 were fed into an 83 mm twin screw extruder and extruded at 182° C. between the support sheet of Examples 1–3 and a polyethylene terephthalate coversheet with a thickness of 5 mil (0.013 cm) polyethylene terephthalate coated with Macromelt ® 6900 polyamide at a coating weight of 40 mg/dm². The total thickness, except for the polyethylene terephthalate cover sheet, was 107 mils (0.272 cm). The thickness loss was determined as described above and the results are provided in Table 2.

TABLE 2

| Example | Thickness Loss (mils) |
| --- | --- |
| 4 | 1.16 |
| 5 (control) | 4.47 |

EXAMPLES 6–9

Photopolymer compositions were prepared using the following ingredients in parts by weight:

| Ingredient | Example 6 | 7 | 8 | 9 |
| --- | --- | --- | --- | --- |
| Binder 1 | 72 | 68 | 62 | 53 |
| PI-1 | 8 | 12 | 18 | 27 |
| Piccotex | 6 | 6 | 6 | 6 |
| Wax | 1 | 1 | 1 | 1 |
| HMDA | 5.2 | 5.2 | 5.2 | 5.2 |
| HMDMA | 3.7 | 3.7 | 3.7 | 3.7 |
| Initiator | 2 | 2 | 2 | 2 |
| Inhibitor | 2 | 2 | 2 | 2 |
| HEMA | 0.176 | 0.176 | 0.176 | 0.176 |
| Red Dye | 0.0045 | 0.0045 | 0.0045 | 0.0045 |

The above compositions were mixed on a two roll mill and pressed into printing elements as in Examples 1–3. The thickness loss and Shore A hardness values are provided in Table 3 below.

TABLE 3

| Example | Thickness Loss (mils) | Shore A Hardness |
| --- | --- | --- |
| 6 | 1.42 | 53 |
| 7 | 2.08 | 47 |

TABLE 3-continued

| Example | Thickness Loss (mils) | Shore A Hardness |
| --- | --- | --- |
| 8 | 2.07 | 43 |
| 9 | 1.64 | 37 |

EXAMPLES 10 and 11

The following photopolymer compositions were prepared using ingredients listed below in parts by weight:

| Ingredient | Example 10 | 11 |
| --- | --- | --- |
| Binder 2 | 47.0 | 47.0 |
| Binder 3 | 22.3 | 22.3 |
| PB-1 | 11.0 | 11.0 |
| PB-2 | 11.0 | |
| PI-1 | | 11.0 |
| HMDA | 6.5 | 6.5 |
| Initiator | 1.4 | 1.4 |
| Inhibitor | 0.5 | 0.5 |
| HEMA | 0.23 | 0.23 |
| Red dye | 0.006 | 0.006 |

The photopolymer compositions were mixed on a two roll mill at 120°–155° C. for 15 minutes. The mixed compositions were placed between a support sheet of 5 mil Mellinex ® 561 polyester (I.C.I. Corp., Wilmington, DE) and a cover sheet of 5 mil polyethyleneterephthalate coated with Macromelt ® 6900 polyamide at a coating weight of 40 mg/dm². The Macromelt ® layer was overcoated with a layer of Joncryl ® CDX-586 resin (S. C. Johnston and Son, Inc., Racine, Wis.) at a coating weight of 10 mg/dm². This was then placed in a hydraulic press at 140° C. and pressed out to form a total thickness, photopolymer plus support and cover sheet, of 250 mils.

The thickness loss and Shore A hardness of processed plates are summarized in Table 4 below.

TABLE 4

| Example | Thickness Loss (mils) | Shore A Hardness |
| --- | --- | --- |
| 10 (control) | 8.1 | 47 |
| 11 | 5.8 | 44 |

What is claimed is:

1. A photosensitive element comprising a support and a photopolymerizable layer, said photopolymerizable layer comprising:
   (a) a thermoplastic elastomeric block copolymer binder;
   (b) a photoinitiator system activated by actinic radiation;
   (c) at least one nongaseous ethylenically unsaturated monomer; and
   (d) a liquid polyisoprene plasticizer having a molecular weight of at least about 29,000;
   wherein the solvent resistance of said element is substantially improved.

2. The element of claim 1 wherein the binder consists essentially of styrene-isoprene-styrene.

3. The element of claim 1 wherein the binder consists essentially of styrene-butadiene-styrene.

4. The element of claim 1, 2, or 3 wherein the binder is present in at least the amount of about 65% of the total weight of the photopolymerizable layer.

5. The element of claim 1 wherein the polyisoprene is present in at least the amount of about 8% of the total weight of the photopolymerizable layer.

6. The element of claim 1 wherein a multilayer cover element is adjacent to the photopolymerizable layer, said cover element comprising a flexible cover film and a layer of an elastomeric composition, the layer of elastomeric composition being adjacent to the photopolymerizable layer and being photosensitive or becoming photosensitive by contact with the photopolymerizable layer, said layer of elastomeric composition comprising an elastomeric polymeric binder, a second polymeric binder and an optional nonmigratory dye or pigment.

7. The element of claim 6 wherein said multilayer cover element bears a flexible polymeric film between the elastomeric composition layer and the flexible cover film.

8. The photosensitive element of claims 1, 6 or 7 wherein the liquid polyisoprene has a molecular weight in the range from about 29,000 to about 50,000.

9. A process for making a printing relief from the flexographic photosensitive element comprising:
   (a) imagewise exposing a photopolymerizable layer of the element of claim 1;
   (b) removing the non-polymerized unexposed areas of the photopolymerizable layer and;
   (c) applying post development treatment;
wherein the solvent resistance of the flexographic relief printing plate is substantially improved by adding to the photopolymerizable layer a liquid polyisoprene plasticizer having a molecular weight of at least about 29,000.

10. The process of claim 9 wherein the binder consists essentially of styrene-isoprene-styrene block copolymer.

11. The process of claim 9 wherein the binder consists essentially of styrene-butadiene-styrene block copolymer.

12. The process of claim 9, 10, or 11 wherein the binder is present in at least an amount of about 65% of the total weight of the photopolymerizable layer.

13. The process of claim 9 wherein the photosensitive element further comprises a multilayer cover element adjacent to the photopolymerizable layer, said cover element comprising a flexible cover film and a layer of an elastomeric composition, the layer of elastomeric composition being adjacent to the photopolymerizable layer and being photosensitive or becoming photosensitive by contact with the photopolymerizable layer, said layer of elastomeric composition comprising an elastomeric polymeric binder, a second polymeric binder and an optional nonmigratory dye or pigment.

14. The process of claim 13 wherein the multilayer cover element bears a flexible polymeric film between the elastomeric composition and the flexible cover film.

15. The process of claims 13 or 14 wherein the liquid polyisoprene has a molecular weight in the range from about 29,000 to about 50,000.

16. The process of claim 9 wherein the liquid polyisoprene is present in at least an amount of about 8% of the total weight of the photopolymerizable layer.

* * * * *